(12) United States Patent
Chen et al.

(10) Patent No.: US 11,894,357 B2
(45) Date of Patent: Feb. 6, 2024

(54) SYSTEM-LEVEL PACKAGING STRUCTURE AND METHOD FOR LED CHIP

(71) Applicant: SJ SEMICONDUCTOR (JIANGYIN) CORPORATION, Jiangyin (CN)

(72) Inventors: Yenheng Chen, Jiangyin (CN); Chengchung Lin, Jiangyin (CN)

(73) Assignee: SJ SEMICONDUCTOR (JIANGYIN) CORPORATION, Jiangyin (CN)

( * ) Notice: Subject to any disclaimer, the term of this patent is extended or adjusted under 35 U.S.C. 154(b) by 330 days.

(21) Appl. No.: 17/471,574

(22) Filed: Sep. 10, 2021

(65) Prior Publication Data

US 2022/0077132 A1    Mar. 10, 2022

(30) Foreign Application Priority Data

Sep. 10, 2020  (CN) ......................... 202010947512.4
Sep. 10, 2020  (CN) ......................... 202021970939.8

(51) Int. Cl.
*H01L 25/18* (2023.01)
*H01L 23/31* (2006.01)
(Continued)

(52) U.S. Cl.
CPC .......... *H01L 25/18* (2013.01); *H01L 21/4857* (2013.01); *H01L 21/561* (2013.01);
(Continued)

(58) Field of Classification Search
CPC ... H01L 25/18; H01L 21/4857; H01L 21/561; H01L 21/568; H01L 21/78; H01L 23/3135; H01L 23/367; H01L 23/42; H01L 23/5383; H01L 24/16; H01L 24/94; H01L 33/54; H01L 33/62; H01L 2224/16225; H01L 2933/005; H01L 23/5389; H01L 24/20; H01L 24/32; H01L 24/73; H01L 33/0095; H01L 24/19; H01L 2224/04105;
(Continued)

(56) References Cited

U.S. PATENT DOCUMENTS 7,851,899 B2 * 12/2010 Chen ....................... H01L 23/13
                                                                  438/126
8,703,542 B2 *  4/2014 Lin ......................... H01L 24/82
                                                                  438/118
(Continued)

*Primary Examiner* — Vu A Vu
(74) *Attorney, Agent, or Firm* — Alston & Bird LLP

(57) ABSTRACT

The present invention provides a SiP structure and method for a light emitting diode (LED) chip. The packaging structure includes: a heat sink structure, a first chip, a first packaging layer, a second packaging layer, a rewiring layer, an LED chip, a printed circuit board (PCB), and a third packaging layer. In the present invention, chips with a plurality of functions, including the first chip, the LED chip, and the like, are integrated into one packaging structure through fan-out system-level packaging, to meet a plurality of different system functional requirements and improve the performance of the packaging system. By the rewiring layer, a metal connecting pillar, a metal lead wire, and the like, the first chip, the LED chip, and the PCB are electrically connected, to achieve a three-dimensional vertically stacked package thereby effectively reducing the area of a SiP and improving the integration of the packaging system.

10 Claims, 7 Drawing Sheets

(51) Int. Cl.
*H01L 23/538* (2006.01)
*H01L 23/00* (2006.01)
*H01L 33/62* (2010.01)
*H01L 33/54* (2010.01)
*H01L 23/42* (2006.01)
*H01L 21/56* (2006.01)
*H01L 21/78* (2006.01)
*H01L 21/48* (2006.01)
*H01L 23/367* (2006.01)

(52) U.S. Cl.
CPC ............ *H01L 21/568* (2013.01); *H01L 21/78* (2013.01); *H01L 23/3135* (2013.01); *H01L 23/367* (2013.01); *H01L 23/42* (2013.01); *H01L 23/5383* (2013.01); *H01L 24/16* (2013.01); *H01L 24/94* (2013.01); *H01L 33/54* (2013.01); *H01L 33/62* (2013.01); *H01L 2224/16225* (2013.01); *H01L 2933/005* (2013.01)

(58) Field of Classification Search
CPC . H01L 2224/12105; H01L 2224/16227; H01L 2224/214; H01L 2224/32225; H01L 2224/32245; H01L 2224/73267; H01L 2224/92244; H01L 2224/94; H01L 2224/96; H01L 2924/12041; H01L 2924/1433; H01L 2924/18161; H01L 2924/18162; H01L 2924/19107; H01L 23/564; H01L 25/167; H01L 25/50; H01L 2221/68304; H01L 2221/68327; H01L 2221/68345; H01L 2933/0066; H01L 21/6835
USPC .......................................................... 257/99
See application file for complete search history.

(56) References Cited

U.S. PATENT DOCUMENTS

| | | | | |
|---|---|---|---|---|
| 9,379,078 | B2* | 6/2016 | Yu | H01L 25/50 |
| 9,385,095 | B2* | 7/2016 | Jeng | H01L 23/3128 |
| 9,564,416 | B2* | 2/2017 | Hou | H01L 24/20 |
| 9,659,805 | B2* | 5/2017 | Hu | H01L 21/2885 |
| 9,768,090 | B2* | 9/2017 | Liang | H01L 23/5384 |
| 10,026,671 | B2* | 7/2018 | Yu | H01L 23/36 |
| 10,340,206 | B2* | 7/2019 | Yu | H01L 21/486 |
| 10,354,964 | B2* | 7/2019 | Yu | H01L 23/3114 |
| 10,354,983 | B2* | 7/2019 | Yu | H01L 23/49811 |
| 10,510,650 | B2* | 12/2019 | Yu | H01L 21/6835 |
| 11,158,614 | B2* | 10/2021 | Cheng | H01L 23/36 |
| 11,183,487 | B2* | 11/2021 | Lai | H01L 21/78 |
| 11,227,837 | B2* | 1/2022 | Yu | H01L 24/20 |
| 11,387,222 | B2* | 7/2022 | Yu | H01L 25/16 |
| 11,532,533 | B2* | 12/2022 | Yu | H01L 24/25 |
| 2008/0179612 | A1* | 7/2008 | Shin | H01L 33/486 257/E33.056 |
| 2009/0116252 | A1* | 5/2009 | Kille | H05K 1/0204 362/373 |
| 2019/0172802 | A1* | 6/2019 | Chen | H01L 21/56 |
| 2021/0272930 | A1* | 9/2021 | Choi | H01L 25/105 |

* cited by examiner

SYSTEM-LEVEL PACKAGING STRUCTURE AND METHOD FOR LED CHIP

CROSS REFERENCE TO RELATED APPLICATION

The present application claims the benefit of priority to Chinese Patent Application No. CN 2020109475124, entitled "SYSTEM-LEVEL PACKAGING STRUCTURE AND METHOD FOR LED CHIP", and Chinese Patent Application No. CN 2020219709398, entitled "SYSTEM-LEVEL PACKAGING STRUCTURE", both filed with CNIPA on Sep. 10, 2020, the disclosures of which are incorporated herein by reference in its entirety for all purposes.

FIELD OF TECHNOLOGY

The present disclosure generally relates to chip packaging technologies, and in particular, to a system-level packaging structure and method for a light emitting diode chip.

BACKGROUND

With the advent of the era of the 5th generation (5G) communication and artificial intelligence (AI), chips applied to the related fields need to transmit and interactively process an enormous amount of data at high speed. Such chips usually include a huge number of pads (hundreds or even thousands) as well as ultra-small pin sizes and spacings (a few microns or even smaller). On the other hand, demands generated by the mobile Internet and the Internet of Things (IoT) are increasingly stronger. Miniaturization and multi-functionalization of electronic terminal products are trending in the industry. How to integrate and package a plurality of high-density chips of different types to form a powerful system or sub-system with a relatively small size and relatively low power consumption has become a challenge in the field of advanced semiconductor chip packaging.

At present, high-density integrated multi-chip packaging is usually performed in the industry by using a through-silicon-via (TSV), a silicon (Si) interposer, or the like. In this way, ultra-fine pins of the chips are led out and effectively interconnected, so as to form a functional module or system. However, the technology is relatively costly, which significantly limits the application scope thereof. The fan-out packaging technology provides a good platform for integrated multi-chip packaging through wafer reconstruction and rewiring. However, in existing fan-out packaging technologies, the package has a relatively large area and a relatively large thickness due to limited precision of wiring, and there are other problems such as complex procedures and low reliability. Furthermore, existing LED chip packaging structures are generally chip-on-board (COB) packages, which are mostly chip-level packaging structures. Such a package features low cost and a simple structure, but has unreliable connections. As the chip size decreases, it gets more difficult for the package to be effectively integrated with another integrated circuit chip. As the demands for packaging components and functions are increasingly high, existing system-in-package (SiP) is set to occupy an increasingly large area and thickness, which is adverse to obtaining a higher degree of integration.

Therefore, it is necessary to provide a novel SiP structure for an LED chip and a method for manufacturing same, to resolve the foregoing problems.

SUMMARY

The present invention provides a system-level packaging method for an LED chip. The packaging method comprises the following steps:

providing a chip wafer comprising a first surface and a second surface opposite to each other, where the chip wafer comprises a plurality of first chips;

forming a plurality of connecting pillar structures on the first surface of the chip wafer to electrically lead out the first chips;

forming a first packaging layer on the first surface of the chip wafer, where the first packaging layer covers the connecting pillar structures;

cutting the chip wafer to form a plurality of first-chip initial packaging structures, comprising the first chips, the connecting pillar structures located on the first chips, and the first packaging layer covering the connecting pillar structures;

providing a supporting substrate, forming a separation layer on the supporting substrate, and forming a second surface of the first-chip initial packaging structures on the separation layer;

forming a second packaging layer on the separation layer, where the second packaging layer covers the first-chip initial packaging structures, and thinning the second packaging layer to expose the connecting pillar structures;

preparing a rewiring layer on the second packaging layer, where the rewiring layer is electrically connected to the connecting pillar structures;

peeling off the supporting substrate based on the separation layer to expose the second surface of the first-chip initial packaging structures, and performing cutting to obtain first-chip intermediate packaging structures;

providing an LED chip and forming the LED chip on a side of the rewiring layer away from the first-chip initial packaging structures, to obtain a chip combination packaging structure;

forming the chip combination packaging structure on a heat sink structure and electrically connecting the side of the rewiring layer with the LED chip formed thereon to a printed circuit board (PCB) by a metal lead wire; and forming a third packaging layer at least around the LED chip to obtain a SiP structure for the LED chip.

Optionally, the packaging method further comprises a step of forming a protective layer on the separation layer. The first-chip initial packaging structures are formed on a surface of the protective layer. A step of removing the protective layer is further included after the supporting substrate is peeled off.

Optionally, an upper surface of the first packaging layer is higher than an upper surface of the connecting pillar structures. An upper surface of the second packaging layer is higher than the upper surface of the first packaging layer.

Optionally, the LED chip is formed on the rewiring layer by using a plurality of metal bumps such that the LED chip is electrically connected with the metal bumps. The third packaging layer is further formed among the metal bumps at the bottom of the LED chip.

Optionally, the PCB is formed on the heat sink structure and is located on a side portion of the chip combination packaging structure. The third packaging layer is further formed above the PCB and the rewiring layer and covers the metal lead wire.

Optionally, a thermal adhesive layer is further formed between the chip combination packaging structure and the heat sink structure.

Optionally, the first chips comprise an application-specific integrated circuit (ASIC) chip.

The present invention further provides a SiP structure for an LED chip. For the SiP structure for an LED chip, the packaging method consistent with the present invention is preferably adopted. Other packaging methods in the similar scope may also be adopted. The packaging structure comprises:
- a heat sink structure;
- a first chip, formed on the heat sink structure;
- a connecting pillar structure, formed on the first chip to electrically lead out the first chip;
- a first packaging layer, formed on the first chip, where the first packaging layer covers the connecting pillar structure, and the first chip, the connecting pillar structure, and the first packaging layer constitute a first-chip initial packaging structure;
- a second packaging layer, formed on the heat sink structure, and covering the first-chip initial packaging structure;
- an rewiring layer, formed on the second packaging layer and the first-chip initial packaging structure, where the rewiring layer is electrically connected to the connecting pillar structure;
- an LED chip, formed on a side of the rewiring layer away from the first-chip initial packaging structure;
- a PCB, electrically connected by a metal lead wire to the side of the rewiring layer with the LED chip formed thereon; and
- a third packaging layer, formed at least around the LED chip.

Optionally, an upper surface of the first packaging layer is flush with an upper surface of the second packaging layer and exposes the connecting pillar structure. A plurality of metal bumps is formed between the LED chip and the rewiring layer to electrically connect the LED chip and the rewiring layer. The third packaging layer is further formed among the metal bumps at the bottom of the LED chip.

Optionally, the PCB is formed on the heat sink structure and is located on a side portion of the chip combination packaging structure. The third packaging layer is further formed above the PCB and the rewiring layer and covers the metal lead wire.

Optionally, a thermal adhesive layer is further formed between the chip combination packaging structure and the heat sink structure.

Optionally, the first chips comprise an ASIC chip.

As described above, in the SiP structure and method for an LED chip consistent with the present invention, chips with a plurality of functions, comprising, for example, the LED chip and the ASIC chip, are integrated into one packaging structure through fan-out system-level packaging, to meet various system functional requirements and improve the performance of the packaging system. By the rewiring layer and metal connecting pillar, a three-dimensional vertically stacked package is obtained, to effectively reduce the area of a SiP and improve the integration of the packaging system. By the rewiring layer, the metal connecting pillar, the metal lead wire, and the like, the first chip (for example, the ASIC chip), the LED chip, and the PCB are electrically connected, and rewiring layers are closely connected, to effectively shorten the conductive path between the chips and lower the power consumption of the packaging system. The chips are packaged and protected by the first packaging layer, the second packaging layer, and the third packaging layer, and a reliable packaging structure is thereby obtained.

BRIEF DESCRIPTION OF THE DRAWINGS

FIG. 18 is a schematic cross sectional view of a fan-out SiP structure according to an embodiment.

DETAILED DESCRIPTION

The implementations of the present invention are described below through specific examples. A person skilled in the art can easily understand other advantages and effects of the present invention from the content disclosed in this specification. The present invention may also be implemented or applied through other different specific implementations. Various details in this specification may also be modified or changed based on different viewpoints and applications without departing from the spirit of the present invention.

For example, when the embodiments of the present invention are described in detail, for ease of description, cross-sectional views representing the device structures are partially enlarged not necessary to scale. In addition, the schematic diagrams are merely examples, and should not limit the scope of the present invention.

For ease of description, terms indicating spatial relationships such as "below", "under", "lower than", "beneath", "over", and "above" may be used herein to describe the relationships between an element or feature and another element or feature shown in the accompanying drawings. It should be understood that, the terms indicating spatial relationships are intended to include directions other than direction of the devices in use or in operation as depicted in the accompanying drawings. Moreover, when a layer is referred to as being "between" two layers, the layer may be the only layer between the two layers, or there may be one or more layers therebetween. Furthermore, when "between . . . " is used in the present invention, it implies that two corresponding endpoints are included.

It should be noted that, the drawings provided in the embodiments only exemplify the basic idea of the present invention. Therefore, the drawings only show the components related to the present invention, and are not drawn according to the quantities, shapes, and sizes of the components during actual implementation. During actual implementation, the types, quantities, and proportions of the components may be adjusted as needed, and the layout pattern of the components may be more complex.

Figure 1:
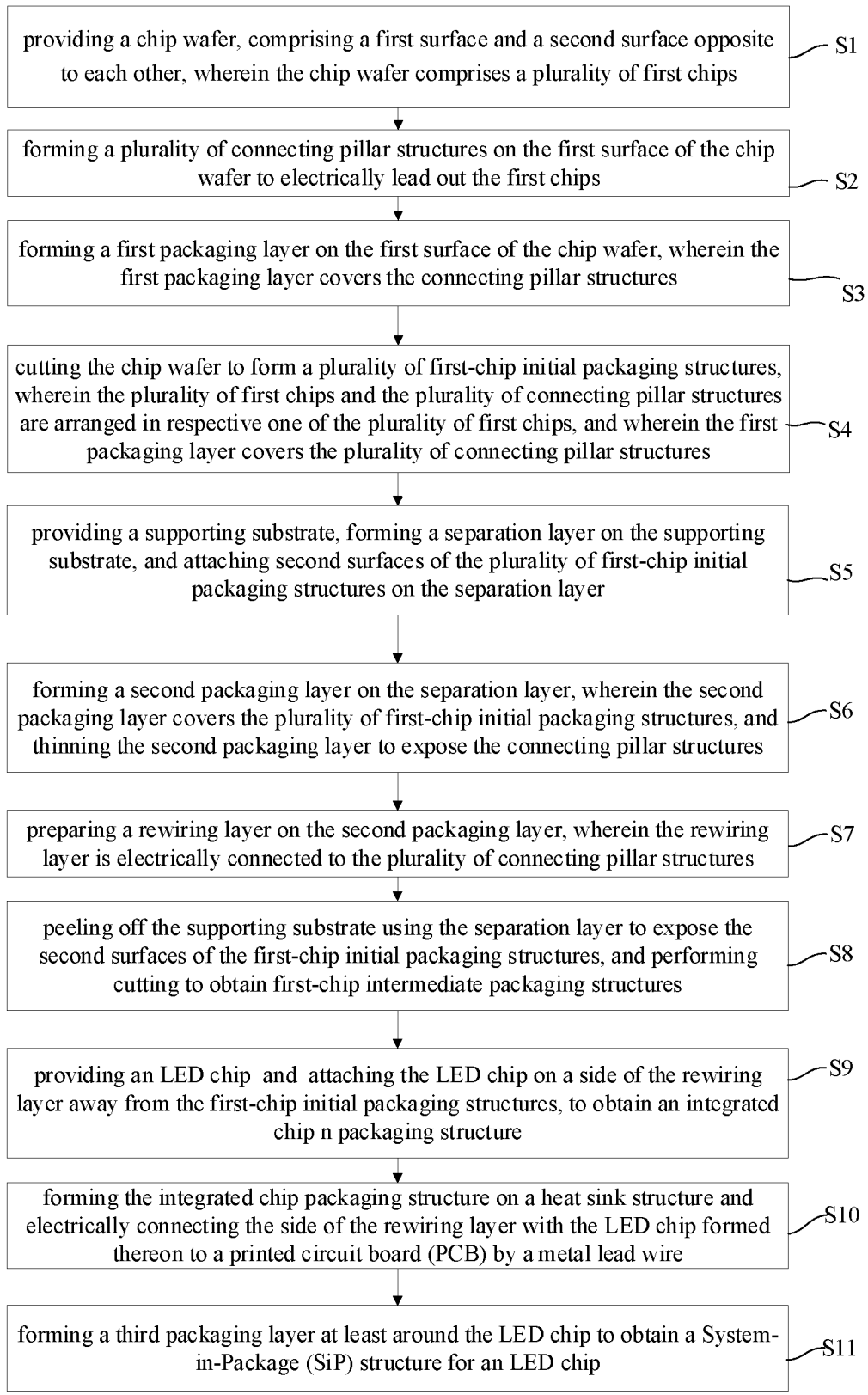
FIG. 1 is a flowchart of showing process steps of making a SiP for an LED chip according to the present invention.

As shown in FIG. 1, the present invention provides a system-level packaging method for an LED chip. The packaging method comprises the steps described below.

Figure 2:
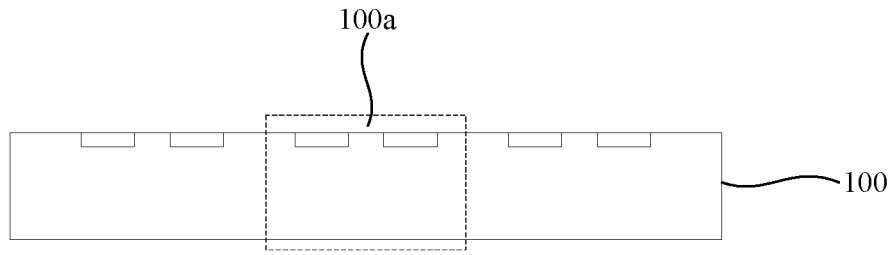
FIG. 2 to FIG. 18 are schematic diagrams of showing various intermediate structures obtained after steps of a method in manufacturing a SiP for an LED chip according to the present invention, where

First, as indicated by S1 in FIG. 1 and FIG. 2, step S1 provides a chip wafer 100 comprising a first surface and a second surface opposite to each other, where the chip wafer 100 comprises a plurality of first chips 100a. As an example, the chip wafer 100 may be an ASIC wafer, and the first chips 100a may be ASIC chips. The first surface of the chip wafer 100 constitutes the first surfaces of the first chips 100a, and the second surface of the chip wafer 100 constitutes second surfaces of the first chips 100a. A person skilled in the art may understand that subsequent corresponding descriptions may be made based on the above. In an example, the front surfaces of the first chips are the first surfaces. The back surfaces of the first chips are the second surfaces.

Figure 3:
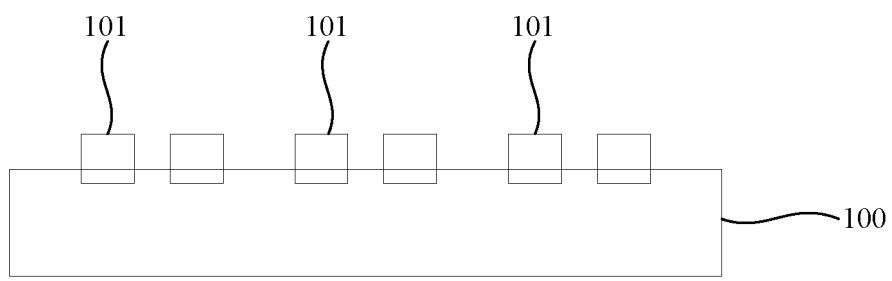

Next, as indicated by S2 in FIG. 1 and FIG. 3, step S2 forms a plurality of connecting pillar structures 101 on the first surface of the chip wafer 100 to electrically lead out the first chips 100a. The connecting pillar structures 101 may be copper pillars. In an example, a further step forms a seed layer prior to the connecting pillar structures 101 are formed. In an example, the connecting pillar structures 101 are electrically connected to bonding pads of the first chips 100a to electrically lead out the first chips. In an example, a process for forming the copper pillars is provided. An insulation layer may be formed on the chip wafer. Through-holes exposing the bonding pads of the first chips are formed in the insulation layer. Then, the connecting pillar structures 101 are attached on the bonding pads or the seed layer by using an electroplating process. During electroplating, the insulation layer can be used as a blocking layer. The connecting pillar structures are only generated at the through-holes. In addition, connecting pillar structures 101 made by using the electroplating process may have a relatively large width, for example, a width of 50 μm or above, for one example, 80 μm to more than 100 μm, for another example, 120 μm to 150 μm, to greatly improve conductivity thereof. The connecting pillar structures 101 may be disposed vertically to shorten a conductive path. The connecting pillar structures 101 are made of metal materials from one of Au, Ag, Cu, and Al. In this embodiment, the connecting pillar structures 101 may be made of copper so as to improve the stability and reduce the resistance.

Figure 4:
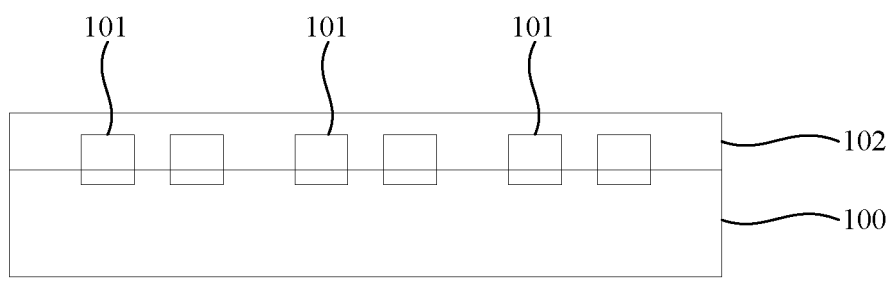

Next, as indicated by S3 in FIG. 1 and FIG. 4, step S3 is performed to form a first packaging layer 102 on the first surface of the chip wafer 100, where the first packaging layer 102 covers the connecting pillar structures 101. A method for forming the first packaging layer 102 comprises one of compression molding, transfer molding, liquid seal molding, vacuum laminating, and spin coating. A material of the first packaging layer 102 comprises one of polyimide (PI), silica gel, and epoxy. In a preferred example, a PI material layer is selected. That is, the first packaging layer 102 is formed by performing PI coating. In an example, in this step, an upper surface of the first packaging layer 102 is higher than an upper surface of the connecting pillar structure 101 to facilitate chip protection.

Figure 5:
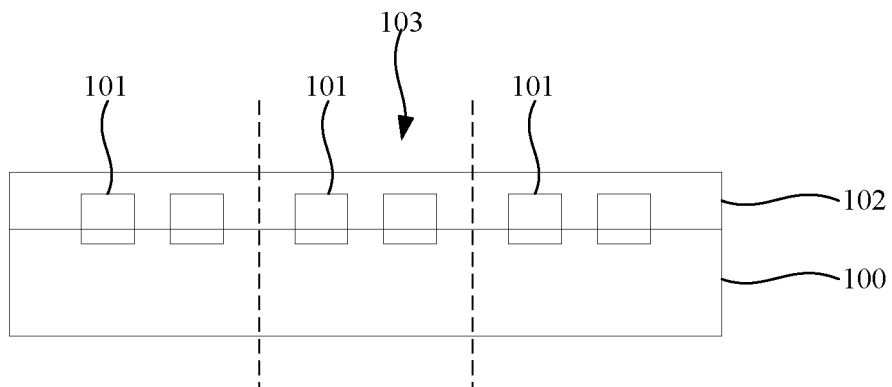
Figure 6:
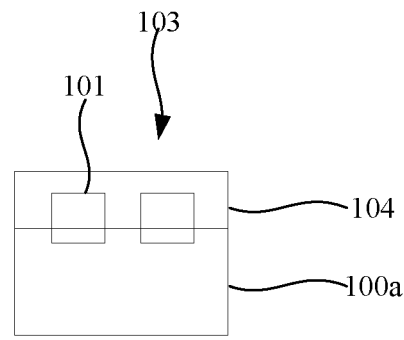
Figure 7:
Figure 8:
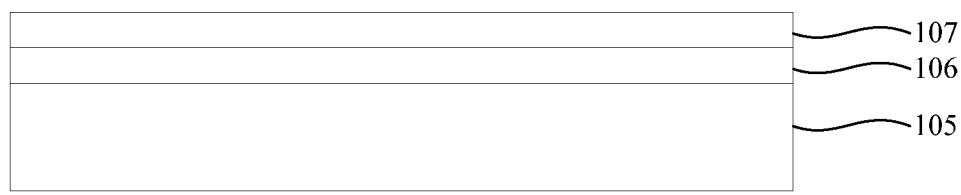
Figure 9:
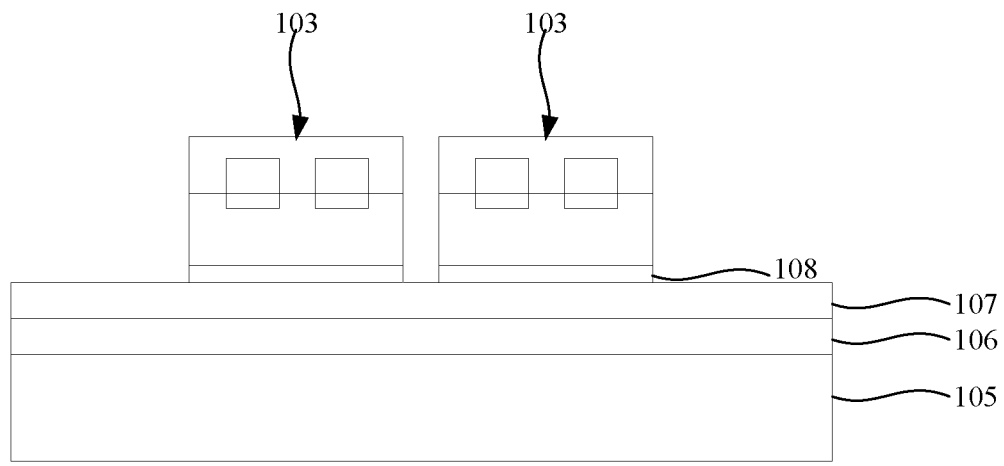

Next, as indicated by S4 in FIG. 1, FIG. 5, and FIG. 6, step S4 is performed to cut the chip wafer 100 into a plurality of first-chip initial packaging structures 103, comprising the respective first chips 100a, the respective connecting pillar structures 101 located on the respective first chips, and the respective first packaging layer covering the respective connecting pillar structures, that is, the first packaging layer 104 of the first chips (i.e., the respective part of the first packaging layer 102 that is on the respective first chips 100a). By this step, the first-chip initial packaging structures 103 are formed for subsequent die bonding. The first-chip initial packaging structure 103 may be cut by a laser, to obtain independent respective packaging structures, which is beneficial to protecting the chips and the packaging layer and meeting cutting requirements.

Next, as indicated by S5 in FIG. 1 and FIG. 7 to FIG. 9, step S5 is performed to provide a supporting substrate 105, form a separation layer 106 on the supporting substrate, and attach the second surface of the first-chip initial packaging structures 103 to an interfacial layer 108 above a protective layer 107 on the separation layer 106.

For example, the supporting substrate 105 comprises one of a glass substrate, a metal substrate, a semiconductor substrate, a polymer substrate, and a ceramic substrate. In this embodiment, a glass substrate is selected as the supporting substrate 105. The glass substrate has the advantage of low costs. It is also adaptable to form the separation layer 106 on a surface of the glass substrate, and therefore, the process of a subsequent peel-off process will not be very demanding.

For example, the separation layer 106 comprises a light-to-heat conversion (LTHC) layer. After being formed on the supporting substrate 105 using a spin coating process, the LTHC layer is cured and molded using a curing process. The LTHC layer features stable performance and a relatively smooth surface, which facilitates subsequent manufacturing of a rewiring layer (aka, redistribution layer, or RDL). In addition, the peel-off challenge is relatively low in the subsequent peel-off process.

In addition, the first-chip initial packaging structures 103 obtained by preparation of the foregoing steps are arranged side by side to attach to the supporting substrate 105 via the separation layer 106. The arrangement of the first-chip initial packaging structures 103 over the supporting substrate is adjustable according to process requirements. In an example, the packaging method further comprises a step of forming a protective layer 107 on the separation layer 106. The first-chip initial packaging structures 103 are formed on a surface of the protective layer 107. A step of removing the protective layer 107 is further included after the supporting substrate is peeled off. The protective layer 107 may be made of PI or epoxy through spin coating. The protective layer 107 may protect the first chips and prevent corrosive gases, water vapor, and the like from damaging a system-level chip and a power management chip.

In an example, the first-chip initial packaging structures 103 may be directly bonded to the separation layer or the protective layer by using insulation glue. For example, the second surface of the first chips is directly bonded thereto, which is a simple process and can effectively reduce costs. Alternatively, a die-attach-film (DAF) may be used to implement bonding of the first chips.

Figure 10:
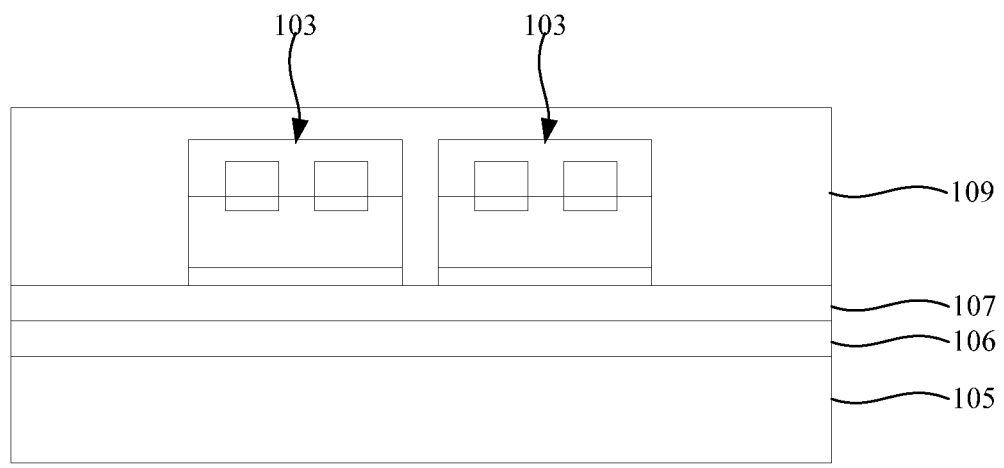
Figure 11:
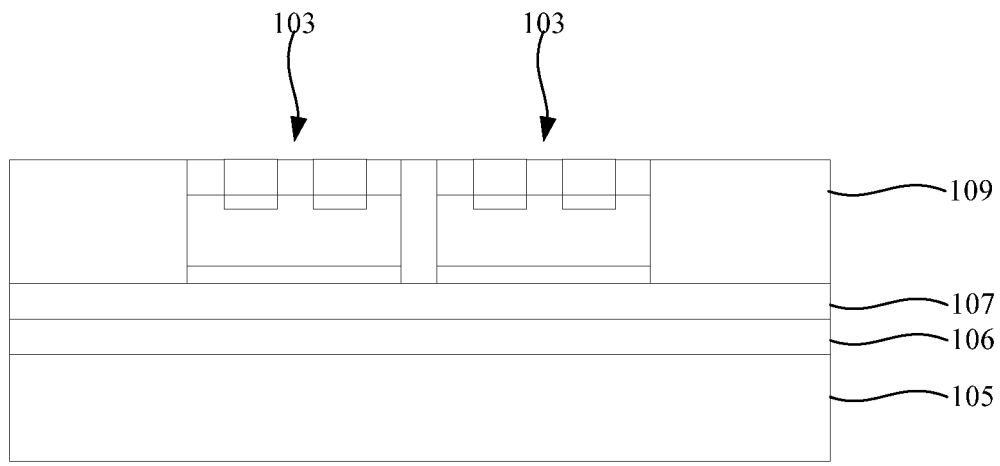

Next, as indicated by S6 in FIG. 1, FIG. 10 and FIG. 11, step S6 is performed to form a second packaging layer 109 on the separation layer 106 (molding), where the second packaging layer 109 covers the first-chip initial packaging structures 103, and the second packaging layer 109 is thinned to expose the top surfaces of the connecting pillar structures 101.

A method for forming the second packaging layer 109 comprises one of compression molding, transfer molding, liquid seal molding, vacuum laminating, and spin coating. A material of the second packaging layer 109 comprises one of PI, silica gel, and epoxy. In an example, an upper surface of the formed second packaging layer 109 is higher than the first packaging layer 102 in the structure packaged by the second packaging layer 109. Further, optionally, during thinning, the second packaging layer 109 and the first packaging layer 102 are thinned until the top surfaces of the connecting pillar structures 101 are exposed. In this case, the upper surfaces of the second packaging layer 109 and the first packaging layer 102 are flush with each other. The first chips 100a are covered by both the second packaging layer 109 and the first packaging layer 102. It should be noted that, the packaging layers before and after thinning are represented by same reference names, which can be understood by a person skilled in the art.

Figure 12:
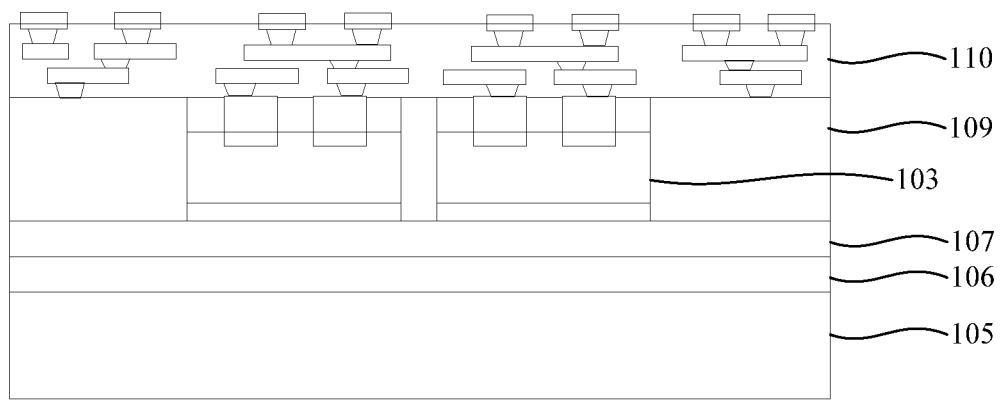
Figure 13:
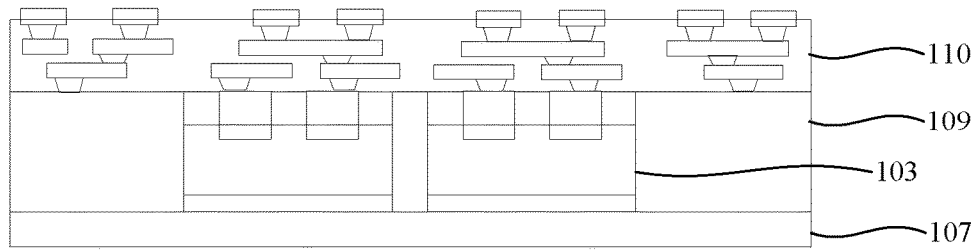
Figure 14:
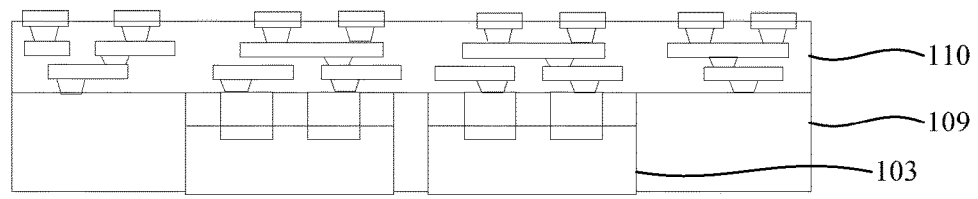
Figure 15:
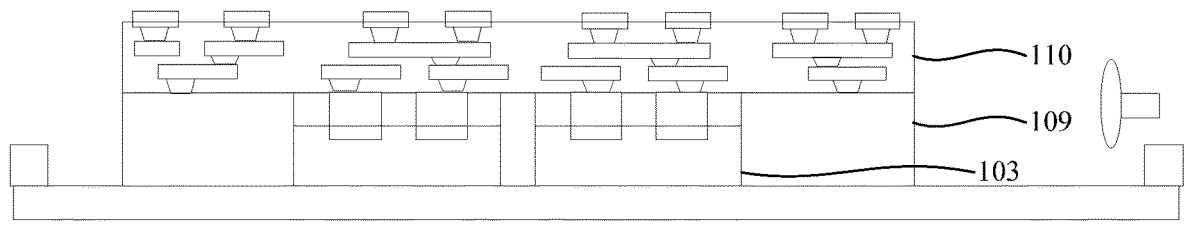

Next, as indicated by S7 in FIG. 1 and FIG. 12, step S7 is performed to prepare a rewiring layer 110 on the second packaging layer 109. The rewiring layer 110 is electrically connected to the connecting pillar structures 101. In this way, the first chips 100a can be electrically led out. The rewiring layer 110 comprises a metal wiring layer. The metal wiring layer is electrically connected to the connecting pillar structures 101. The connecting pillar structures 101 are electrically connected to the first chips 100a.

For example, manufacturing the rewiring layer 110 comprises the following steps.

First, a first dielectric layer is formed on surfaces of the second packaging layer and the first-chip initial packaging structure using a chemical vapor deposition (CVD) or physical vapor deposition (PVD) process. A material of the first dielectric layer comprises one or more of epoxy, silica gel, PI, lead oxide (PbO), BCB, silicon oxide, phosphosilicate glass, and fluorine-containing glass. Preferably, PI is selected as the material of the first dielectric layer 201 to further reduce process difficulty and process costs.

Next, a first metal layer is formed on a surface of the first dielectric layer using a sputtering process, and the metal layer is etched to form a patterned first metal wiring layer. A material of the first metal wiring layer comprises one or more of Cu, Al, Ni, Au, Ag, and Ti.

Next, a second dielectric layer is formed on a surface of the patterned first metal wiring layer using the CVD or PVD process, and the second dielectric layer is etched to form a second dielectric layer with a patterned through hole. A material of the second dielectric layer comprises one or more of epoxy, silica gel, PI, PbO, BCB, silicon oxide, phosphosilicate glass, and fluorine-containing glass. Preferably, PI is selected as the material of the second dielectric layer to further reduce the process difficulty and process costs.

Next, a conductive plug is filled in the patterned through hole. A second metal layer is then formed on a surface of the second dielectric layer using the sputtering process, and the metal layer is etched to form a patterned second metal wiring layer. A material of the second metal wiring layer comprises one or more of Cu, Al, Ni, Au, Ag, and Ti.

Finally, the foregoing steps may be repeated to form a rewiring layer with a multi-layer stacked structure, so as to implement different wiring functions. For example, in this embodiment, the rewiring layer 110 further comprises a patterned third dielectric layer, a patterned third metal wiring layer, a patterned fourth dielectric layer, and a patterned fourth metal wiring layer.

Next, as indicated by S8 in FIG. 1 and FIG. 13 to FIG. 15, step S8 is performed to peel off the supporting substrate 105 based on the separation layer 106 to expose the second surface of the first-chip initial packaging structures 103, and perform cutting to obtain first-chip intermediate packaging structures. In this embodiment, the LTHC layer is illuminated by laser, to separate the LTHC layer from the second packaging layer and separate the first-chip initial packaging structure from the supporting substrate 105, thereby peeling off the supporting substrate.

In an example, in a case that the protective layer 107 is formed, in this step, the protective layer 107 is separated from the supporting substrate 105 based on the separation layer 106. Further, after the supporting substrate 105 is peeled off, the protective layer 107 is removed. Further, in a case that another material layer is further formed on the second surface (the back surface in this embodiment) of the first chips 100a, the back surface is thinned, and the material layer is removed, to expose the back surface of the first chips. In an example, a lower surface of the first chips is flush with a lower surface of the second packaging layer. The "upper" and "lower" herein may refer to the "upper" and "lower" in a package as shown in the drawings. Certainly, even when there is no another material layer on the back surface of the first chips, a thinning process may also be performed in this step to provide a planar surface.

In addition, after the thinning, the method further includes a step of cutting the first-chip intermediate packaging structures, to obtain structures of the first chips required for subsequent packaging with an LED chip. During the cutting, the packaging structures may be attached to a blue film (aka, cutting blue film) for subsequent cutting. In an example, the blue film may be removed after the cutting is finished. In an example, the following step is further included before the cutting: The formed structure is placed on the cutting blue film, and the cutting blue film is fixed on a retaining ring, as shown the bottom plate and sides of the structure in FIG. 15.

In an example, a material of the retaining ring comprises one of glass, metal, a semiconductor, polymer, and ceramics. In this embodiment, the material of the retaining ring is glass. If the retaining ring is made of glass, during subsequent separation from the cutting blue film, the retaining ring can be easily peeled off, which improves efficiency and stability of the separation. The retaining ring may be circular, rectangular, or of some other shape as needed. A sticky surface of the cutting blue film is adhered and fixed to the retaining ring, to fix the cutting blue film, thereby preventing the cutting blue film from warping, and improving stability.

Figure 16:
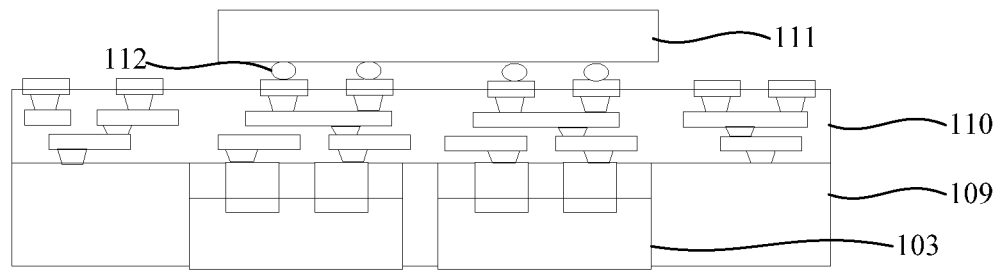

Next, as indicated by S9 in FIG. 1 and FIG. 16, step S9 is performed to provide an LED chip 111, herein the LED chip 111 is attached on a side of the rewiring layer 110 away from the first-chip initial packaging structures 103, and the LED chip 111 is electrically connected to the rewiring layer 110 to obtain a chip combination packaging structure. The LED chip 111 is electrically connected to the first chips 100a (for example, the ASIC chips) by the rewiring layer 110.

In an example, the LED chip 111 is formed on the rewiring layer 110 by electrically connecting to a plurality of metal bumps 112. In an example, a step of forming the metal bumps 112 on a surface of the rewiring layer 110 may be as follows: first, forming an opening or a recess in the dielectric layer on an upper surface of the rewiring layer by using a laser, or forming another dielectric layer on the surface of the rewiring layer first and then, forming an opening or a recess in the dielectric layer, wherein the opening or recess exposes the metal layer in the rewiring layer, and then, manufacturing the metal bumps in the opening or recess. For example, the metal bumps 112 may be made of one of tin solder, silver solder, and gold-tin alloy solder. In another example, connecting solder balls (i.e., the metal bumps) may be manufactured using a re-balling and reflow soldering process. A material of the connecting solder balls may be tin or tin alloy, for example, tin, tin-gold alloy, tin-lead alloy, or the like. The arrangement and selection of the LED chip may be set according to actual conditions.

Figure 17:
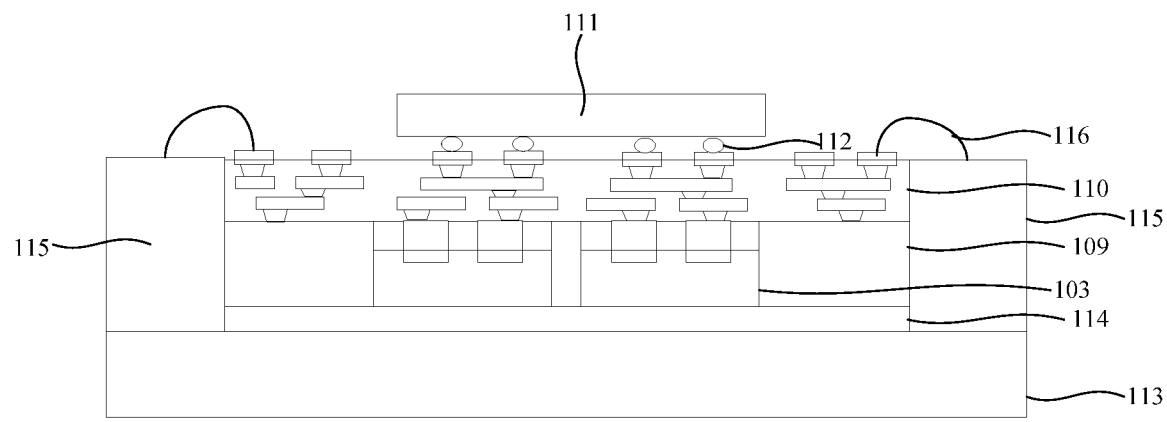

Next, as indicated by S10 in FIG. 1 and FIG. 17, step S10 is performed to form the chip combination packaging structure on a heat sink structure 113 and electrically connect the side of the rewiring layer 110 with the LED chip 111 formed thereon to a PCB 115 by a metal lead wire 116. In this step, the LED chip 111, the first chips 100a, and the PCB 115 are electrically connected by the metal lead wire 116. The electrical lead-out can be implemented based on the rewiring layer. In addition, the metal lead wire 116 can be connected to the rewiring layer 110 and the PCB using an existing process.

In an example, a material of the heat sink structure 113 may be copper or another heat sink material.

In an example, a thermal adhesive layer 114 is further formed between the chip combination packaging structure and the heat sink structure 113. For example, the thermal adhesive layer may be "Hi-PURSHOT", commonly known as PUR, or may be another hot-melt adhesive commonly used in the art.

Figure 18:
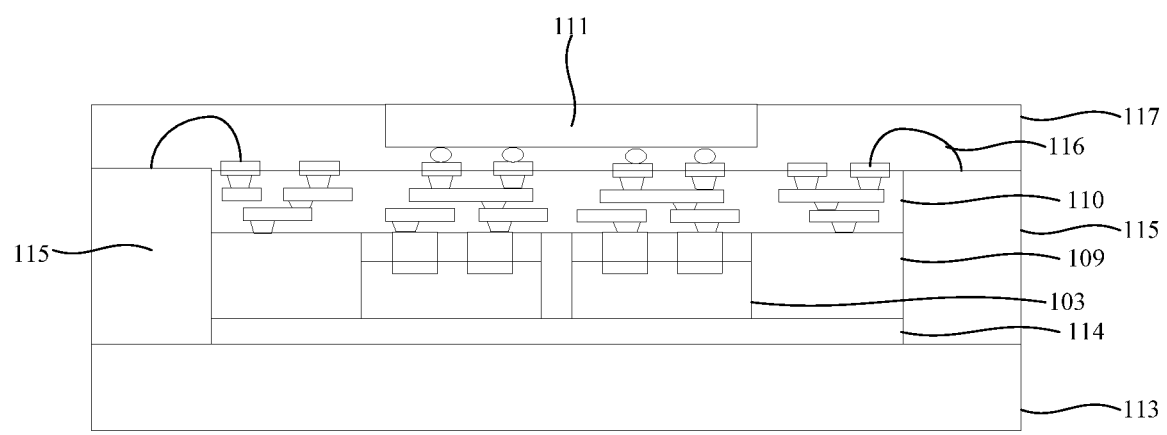

Finally, as indicated by S11 in FIG. 1 and FIG. 18, step S11 is performed to form a third packaging layer 117 at least around the LED chip 111 to obtain a SiP structure for an LED chip. In this step, packaging of an upper portion of the chip combination packaging structure is realized. A method for forming the third packaging layer 117 comprises one of compression molding, transfer molding, liquid seal molding, vacuum laminating, and spin coating. A material of the third packaging layer 117 comprises one of PI, silica gel, and epoxy. In addition, when the metal bumps 112 are already formed, the third packaging layer 117 further fills gaps among the metal bumps 112 at a bottom of the LED chip 111 to improve stability.

In an example, the PCB 115 is formed on the heat sink structure 113 and is located on a side portion of the chip combination packaging structure. The third packaging layer 117 is further formed above the PCB 115 and the rewiring layer 110 and covers the metal lead wire 116. In this example, the PCB 115 is formed on the side portion of the chip combination packaging structure. In other words, the chip combination packaging structure is depressed in a recess formed on the PCB 115. In an example, the PCB is flush with the upper surface of the rewiring layer. The third packaging layer 117 is formed on both the PCB and the rewiring layer and around the LED chip, and covers the metal lead wire 116, thereby realizing the upper portion packaging.

During a specific implementation, overall area dimensions (length×width) of the fan-out SiP structure may be 13 mm×16 mm. Its overall height is less than or equal to 1 mm, and may be 0.5 mm or 0.8 mm. In the present invention, chips with a plurality of functions, comprising the first chip (for example, the ASIC chip), the LED chip, and the like are integrated into one packaging structure through fan-out system-level packaging, so that various system functional requirements are met and the performance of the packaging system improved. That is, a systematic integration that allows integration of different functional chips is formed. In the present invention, by the rewiring layer, a metal connecting pillar, the metal lead wire, and the like, the first chip (for example, the ASIC chip), the LED chip, and the PCB are electrically connected, thereby realizing a three-dimensional vertically stacked package, effectively reducing the area of the SiP and improving the integration of the packaging system. In the present invention rewiring layers are closely connected to each other by the foregoing structures, thereby effectively shortening the conductive path between the chips and lowering the power consumption of the packaging system. The fan-out SiP structure of the present invention can achieve a packaging thickness of less than 1 mm. Compared with that of a conventional packaging structure of a SiP, the overall thickness of the SiP is significantly reduced. In the present invention, the chips are packaged and protected by the first packaging layer, the second packaging layer, and the third packaging layer, to obtain a packaging structure with stable performance.

As shown in FIG. 18, referring to FIGS. 1 to 17, the present invention further provides a SiP structure for an LED chip. For the SiP structure for an LED chip, the packaging method consistent with the present invention is preferably adopted. Certainly, another packaging method may alternatively be adopted. For descriptions of components and related features in the packaging structure, reference may be made to the corresponding descriptions in the packaging method, and details are not repeated herein again. The SiP structure for an LED chip comprises:

a heat sink structure 113;
a first chip 100a, formed on the heat sink structure 113;
a connecting pillar structure 101, formed on the first chip 100a to electrically lead out the first chip 100a;
a first packaging layer 104, formed on the first chip 100a, where the first packaging layer 104 covers the connecting pillar structure 101, and the first chip, the connecting pillar structure, and the first packaging layer constitute a first-chip initial packaging structure 103;
a second packaging layer 109, formed on the heat sink structure 113, and covering the first-chip initial packaging structure 103;
an rewiring layer 110, formed on the second packaging layer 109 and the first-chip initial packaging structure 103, wherein the rewiring layer 110 is electrically connected to the connecting pillar structure 101;
an LED chip 111, formed on a side of the rewiring layer 110 away from the first-chip initial packaging structure;
a PCB 115, electrically connected by a metal lead wire 116 to the side of the rewiring layer 110 with the LED chip 111 formed thereon; and
a third packaging layer 117, formed at least around the LED chip 111.

In an example, an upper surface of the first packaging layer 102 is flush with an upper surface of the second packaging layer 109 and exposes the connecting pillar structure 101. The structure herein has been thinned, which can be understood by a person skilled in the art based on the packaging method.

In an example, a plurality of metal bumps 112 are formed between the LED chip 111 and the rewiring layer 110 to electrically connect the LED chip 111 and the rewiring layer 110. The third packaging layer 117 is further formed among the metal bumps 112 at the bottom of the LED chip 111.

In an example, the PCB 115 is formed on the heat sink structure 113 and is located on a side portion of the chip combination packaging structure. The third packaging layer 117 is further formed above the PCB 115 and the rewiring layer 110 and covers the metal lead wire 116.

In an example, a thermal adhesive layer 114 is further formed between the chip combination packaging structure and the heat sink structure 113.

In an example, the first chip 100a comprises an ASIC chip.

In summary, in the present invention, chips with a plurality of functions, comprising the first chip (for example, the ASIC chip), the LED chip, and the like, are integrated into one packaging structure through fan-out system-level packaging, to meet various system functional requirements and improve the performance of the packaging system. In the present invention, by the rewiring layer, a metal connecting pillar, the metal lead wire, and the like, the first chip (for example, the ASIC chip), the LED chip, and the PCB are electrically connected, to achieve a three-dimensional vertically stacked package, thereby effectively reducing the area of the SiP and improving the integration of the packaging system. In the present invention rewiring layers are closely connected to each other by the foregoing structures, to effectively shorten the conductive path between the chips and lower the power consumption of the packaging system. The fan-out SiP structure consistent with the present invention can achieve a packaging thickness of less than 1 mm. Compared with that of a conventional packaging structure of a SiP, the overall thickness of the SiP is significantly reduced. In the present invention, the chips are packaged and protected by the first packaging layer, the second packaging layer, and the third packaging layer, to obtain a packaging structure with beneficial and stable performance. Therefore, the present invention effectively overcomes various defects in existing technologies and has a high value in industrial use.

The foregoing embodiments merely exemplify the principles and effects of the present invention, but are not intended to limit the present invention. Any person skilled in the art may make modifications or changes on the foregoing embodiments without departing from the spirit and scope of the present invention. Therefore, all equivalent modifications and variations completed by those with ordinary skill in the art without departing from the spirit and technical idea of the present invention should be covered by the claims of the present invention.

What is claimed is:

1. A system-level packaging method for a light emitting diode (LED) chip, comprising:
    providing a chip wafer, comprising a first surface and a second surface opposite to each other, wherein the chip wafer comprises a plurality of first chips;
    forming a plurality of connecting pillar structures on the first surface of the chip wafer to electrically lead out the first chips;
    forming a first packaging layer on the first surface of the chip wafer, wherein the first packaging layer covers the connecting pillar structures;
    cutting the chip wafer to form a plurality of first-chip initial packaging structures, wherein the plurality of first chips and the plurality of connecting pillar structures are arranged in respective one of the plurality of first chips, and wherein the first packaging layer covers the plurality of connecting pillar structures;
    providing a supporting substrate, forming a separation layer on the supporting substrate, and attaching second surfaces of the plurality of first-chip initial packaging structures on the separation layer;
    forming a second packaging layer on the separation layer, wherein the second packaging layer covers the plurality of first-chip initial packaging structures, and thinning the second packaging layer to expose the connecting pillar structures;
    preparing a rewiring layer on the second packaging layer, wherein the rewiring layer is electrically connected to the plurality of connecting pillar structures;
    peeling off the supporting substrate using the separation layer to expose the second surfaces of the first-chip initial packaging structures, and performing cutting to obtain first-chip intermediate packaging structures;
    providing an LED chip and attaching the LED chip on a side of the rewiring layer away from the first-chip initial packaging structures, to obtain an integrated chip packaging structure;
    forming the integrated chip packaging structure on a heat sink structure and electrically connecting the side of the rewiring layer with the LED chip formed thereon to a printed circuit board (PCB) by a metal lead wire;
    forming a third packaging layer at least around the LED chip to obtain a System-in-Package (SiP) structure for an LED chip; and
    forming a protective layer on the separation layer, wherein the plurality of first-chip initial packaging structures are formed on a surface of the protective layer; and
    removing the protective layer after the supporting substrate is peeled off.

2. The system-level packaging method for the LED chip according to claim 1, wherein an upper surface of the first packaging layer is higher than an upper surface of each of the plurality of connecting pillar structures and an upper surface of the second packaging layer is higher than the upper surface of the first packaging layer.

3. The system-level packaging method for the LED chip according to claim 1, wherein the LED chip is formed on the rewiring layer, wherein the LED chip is electrically connected to the rewiring layer via a plurality of metal bumps, and wherein the third packaging layer is further formed among the plurality of metal bumps at a bottom of the LED chip.

4. A System-in-Package (SiP) structure for a light emitting diode (LED) chip, comprising:
    a heat sink structure;
    a first chip, formed on the heat sink structure;
    a connecting pillar structure, formed on the first chip to electrically lead out the first chip;
    a first packaging layer, formed on the first chip, wherein the first packaging layer covers the connecting pillar structure, and wherein the first chip, the connecting pillar structure, and the first packaging layer constitute a first-chip initial packaging structure;
    a second packaging layer, formed on the heat sink structure, and covering the first-chip initial packaging structure;
    a rewiring layer, formed on the second packaging layer and the first-chip initial packaging structure, wherein the rewiring layer is electrically connected to the connecting pillar structure;
    an LED chip, formed on a side of the rewiring layer away from the first-chip initial packaging structure;
    a printed circuit board (PCB), electrically connected by a metal lead wire to a side of the rewiring layer with the LED chip formed thereon;
    a third packaging layer, formed at least around the LED chip;
    wherein an upper surface of the first packaging layer is flush with an upper surface of the second packaging layer, and wherein the first packaging layer exposes the connecting pillar structure, wherein a plurality of metal bumps are formed between the LED chip and the rewiring layer to electrically connect the LED chip and the rewiring layer, and wherein the third packaging layer is further formed among the plurality of metal bumps at a bottom of the LED chip.

5. The SiP structure for the LED chip according to claim 4, wherein the PCB is formed on the heat sink structure and is located on a side portion of an integrated chip packaging structure, and wherein the third packaging layer is further formed above the PCB and the rewiring layer and covers the metal lead wire.

6. The SiP structure for the LED chip according to claim 5, wherein a thermal adhesive layer is further formed between the integrated chip packaging structure and the heat sink structure.

7. The SiP structure for the LED chip according to claim 5, wherein the first chip comprises an application-specific integrated circuit (ASIC) chip.

8. The SiP structure for the LED chip according to claim 4, wherein the PCB is formed on the heat sink structure and is located on a side portion of an integrated chip packaging structure, and wherein the third packaging layer is further formed above the PCB and the rewiring layer and covers the metal lead wire.

9. A system-level packaging method for a light emitting diode (LED) chip, comprising:
   providing a chip wafer, comprising a first surface and a second surface opposite to each other, wherein the chip wafer comprises a plurality of first chips;
   forming a plurality of connecting pillar structures on the first surface of the chip wafer to electrically lead out the first chips;
   forming a first packaging layer on the first surface of the chip wafer, wherein the first packaging layer covers the connecting pillar structures;
   cutting the chip wafer to form a plurality of first-chip initial packaging structures, wherein the plurality of first chips and the plurality of connecting pillar structures are arranged in respective one of the plurality of first chips, and wherein the first packaging layer covers the plurality of connecting pillar structures;
   providing a supporting substrate, forming a separation layer on the supporting substrate, and attaching second surfaces of the plurality of first-chip initial packaging structures on the separation layer;
   forming a second packaging layer on the separation layer, wherein the second packaging layer covers the plurality of first-chip initial packaging structures, and thinning the second packaging layer to expose the connecting pillar structures;
   preparing a rewiring layer on the second packaging layer, wherein the rewiring layer is electrically connected to the plurality of connecting pillar structures;
   peeling off the supporting substrate using the separation layer to expose the second surfaces of the first-chip initial packaging structures, and performing cutting to obtain first-chip intermediate packaging structures;
   providing an LED chip and attaching the LED chip on a side of the rewiring layer away from the first-chip initial packaging structures, to obtain an integrated chip packaging structure;
   forming the integrated chip packaging structure on a heat sink structure and electrically connecting the side of the rewiring layer with the LED chip formed thereon to a printed circuit board (PCB) by a metal lead wire;
   forming a third packaging layer at least around the LED chip to obtain a System-in-Package (SiP) structure for an LED chip;
   wherein the PCB is formed on the heat sink structure and is located on a side portion of the integrated chip packaging structure, and the third packaging layer is further formed above the PCB and the rewiring layer and covers the metal lead wire; and
   wherein a thermal adhesive layer is further formed between the integrated chip packaging structure and the heat sink structure.

10. The system-level packaging method for the LED chip according to claim 9, wherein the first chips comprise an application-specific integrated circuit chip.

* * * * *